United States Patent [19]

Riedger

[11] Patent Number: 4,742,316
[45] Date of Patent: May 3, 1988

[54] PULSE-WIDTH MODULATOR

[75] Inventor: Thomas Riedger, Eckental, Fed. Rep. of Germany

[73] Assignee: U.S. Philips Corporation, New York, N.Y.

[21] Appl. No.: 37,765

[22] Filed: Apr. 13, 1987

[30] Foreign Application Priority Data

Jun. 9, 1986 [DE] Fed. Rep. of Germany ....... 3619353

[51] Int. Cl.$^4$ .............................................. H03K 9/08
[52] U.S. Cl. ...................................... 332/9 R; 332/14
[58] Field of Search ................. 332/9 R, 14; 307/234, 307/510, 518, 525, 265, 273, 593, 597, 260, 261; 328/58, 63

[56] References Cited

U.S. PATENT DOCUMENTS 3,452,297 6/1969 Kelly et al. ............................... 332/9
3,568,094 3/1971 Metzger ............................ 332/14 X Primary Examiner—Eugene R. LaRoche
Assistant Examiner—David Mis
Attorney, Agent, or Firm—Thomas A. Briody; Jack Oisher

[57] ABSTRACT

A pulse-width modulator comprising a square-wave generator which triggers a monostable multivibrator driven by a controllable constant current source, the multivibrator having a capacitor as a timing element. The output of the multivibrator controls a gate circuit to which the square wave is also applied, thereby controlling the width of the square wave output from the gate circuit. The modulator can be assembled from standard CMOS building blocks and several external components, thereby achieving a power dissipation below 10 mW. If the current source is controlled by a CMOS variable-gain amplifier, the modulator can serve as the control circuit of a clocked direct voltage converter having internal losses below 25 mW.

5 Claims, 1 Drawing Sheet

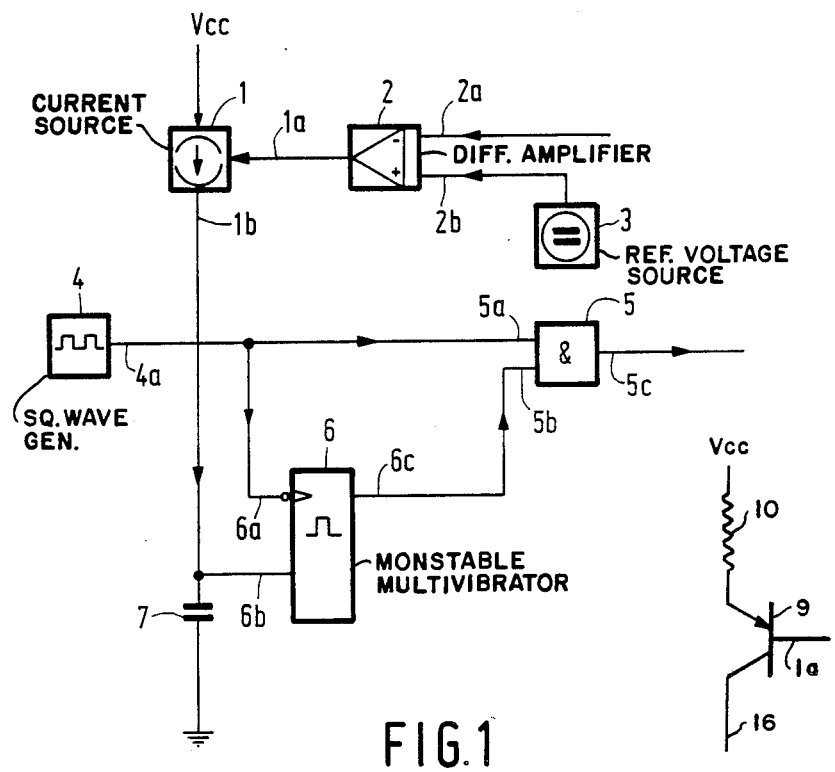
FIG.1
FIG.1A
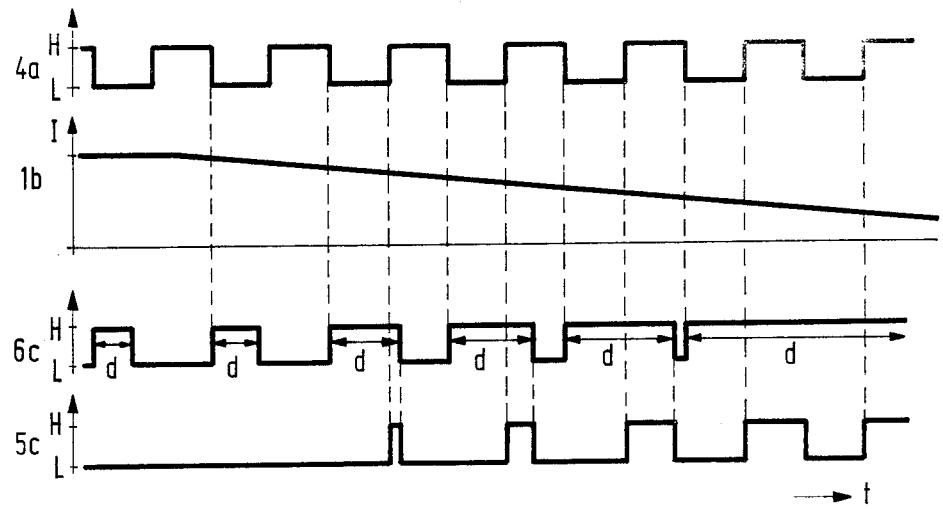
FIG.2

PULSE-WIDTH MODULATOR

BACKGROUND OF THE INVENTION

1. Field of the Invention

The invention relates to a pulse-width modulator wherein through a gate circuit a square-wave oscillation having a fixed duty cycle and a fixed frequency is pulse-width modulated in proportion to the value of an input signal.

2. Description of the Related Art

Pulse-width modulators are, for example, used in clocked and controlled direct voltage converters, therein converting an analog voltage available as a setting quantity into a square-wave signal having a variable duty cycle. With the pulse-width modulated signal the switching transistor of the converter is opened or closed depending on the length of the pulses.

The German Patent DE-PS No. 32 27 296 discloses a pulse-width modulator comprising a sawtooth oscillator, two comparators, an AND-gate and amplifiers. One comparator compares the analog input signal to the sawtooth voltage and the other comparator compares the sawtooth voltage to a time-constant voltage. The time-constant voltage is derived from the supply voltage by a voltage divider. The output voltages of the comparators are applied to the inputs of the AND-gate, whose output signal represents the pulse-width modulated signal. The duty cycle of the output signal varies between a maximum value to be adjusted by the voltage divider and zero value, always according to the amplitude of the continuous input signal.

As the known pulse-width modulator requires two comparators having short-process delay times and a sawtooth generator having a linear ramp voltage and as these building blocks consist of bipolar transistors, it will have a relatively large power dissipation. Therefore, it is, for example, unsuitable for use in clocked direct voltage converters having a switching rate of approximately 20 kHz, if extremely low internal losses are additionally required.

SUMMARY OF THE INVENTION

The invention has for its object to provide a pulse-width modulator as defined in the opening paragraph which can be realized with fast and extremely low-loss building blocks.

The object is accomplished in that a retriggerable monostable multivibrator is provided, whose timing element comprises a compacitor charged by a current source controlled by the input signal, in that the output signal of a square-wave generator is applied to the trigger input of the multivibrator and to an input of the gate circuit and in that the output signal of the multivibrator is applied to the other input of the gate circuit.

The monostable multivibrator, the square-wave generator and the AND-gate mentioned hereinbefore are obtainable as standard CMOS building blocks, which have the extremely low internal losses. For all building blocks together these losses will remain less than 10 mW.

Other advantageous features of the invention are described hereinafter.

BRIEF DESCRIPTION OF THE DRAWINGS

An embodiment of the invention is explained and described in further detail with reference to the drawings in which:

FIG. 1 shows a circuit having features in accordance with the invention and

FIG. 1a shows a transistor circuit for use as current source 1 in the circuit of FIG. 1;

FIG. 2 shows pulse diagrams to elucidate its mode of operation.

DESCRIPTION OF THE PREFERRED EMBODIMENTS

The principal components of the circuit in accordance with FIG. 1 are a controllable current source 1 controlled by an input signal 1a, a square-wave generator 4, an AND-gate 5, a monostable edge-triggered multivibrator 6 and a capacitor 7. The following building blocks are used: the CMOS-timer 7555 as the square-wave generator 4, the CMOS-multivibrator MC 14528 B as the monostable multivibrator 6, a bipolar transistor with an emitter resistance (as described in the text by Tietxe, U.; Schenk, Ch.: Halbleiter-Schaltungstechnik, 5. Auflage, Springer Verlag Berlin, Heidelberg, New York 1980) as the controllable current source and the CMOS-building block MC 14011 B as the AND-gate. FIG. 1a shows such a current source, comprising a PNP transistor 9 having an emitter resistor 10 connected to a d.c. supply VCC. The input signal 1a is applied to the base of transistor 9, and at the collector thereof is produced a current of a magnitude corresponding to the input signal and constituting the output of the current source.

The capacitor 7, one electrode of which is connected to the output 1b of the current source 1, is charged via the controllable current source 1. The other electrode of capacitor 7 is connected to the reference potential. The capacitor 7 and the controllable current source 1 constitute the timing element for the monostable multivibrator 6. If the capacitor voltage exceeds half the operating voltage VCC/2, the level at the output 6c of the multivibrator 6 will change from HIGH to LOW. As the output 4a of the square-wave generator 4 is connected to the trigger input 6a of the monostable multivibrator 6, the capacitor 7 is discharged with every falling (negative) edge of the pulses produced at output 4a of square-wave generator 4.

If the charging current I is sufficiently small, the voltage at capacitor 7 will not reach half the operating voltage VCC/2 during the period between two discharges and the level at the output 6c will remain HIGH.

The HIGH level at the output 6c—owing to output 6c being connected to input 5b of AND-gate 5—causes the AND-gate 5 to open for the complete pulses of the square-wave generator 4 which are applied to an input 5a of the AND-gate 5. Consequently, at output 5c a square-wave oscillation will occur having the same duty cycle as the oscillation of the square-wave generator 4; in both cases the duty cycle of the oscillation is 0.5.

If the charging current I for the capacitor 7 is larger, the capacitor voltage between two discharges will exceed half the value of the operating voltage. Consequently, the level at output 6c of the monostable multivibrator 6 will change to LOW and the pulses of the square-wave generator will be present in a narrower shape at the output 5c of AND-gate 5, thus reducing the duty cycle. With the maximum charging current I there are no pulses present at output 5c.

The pulse diagrams of FIG. 2 show the described cycles in more detail. The amplitudes of the binary signals are represented by their levels H (HIGH) and L (LOW). The reference character of the output where the signal occurs is shown on the left of each diagram. Thus the top diagram shows the pulse sequence at output 4a of the square-wave generator 4. The next diagram shows a possible variation of the output current I of the controllable current source 1. Starting from a maximum value the current I continuously decreases. The third diagram from the top shows how the signal at output 6c changes as a function of the current I; d symbolizes the charging time of the capacitor 7 until half the operating voltage is reached. The bottom diagram shows the associated signal at output 5c and AND-gate 5. The change of the duty cycle from 0 for large charging currents I to 0.5 for small charging currents is very distinct.

A differential amplifier 2 and a reference voltage source 3 in FIG. 1 enable an advantageous use to be made of the thusfar described pulse-width modulator, namely its insertion in the control system of a pulsed direct voltage converter. The output voltage of the differential amplifier 2 serves as the input signal 1a which controls the controllable current source 1. The controlled variable—in this case the output voltage of the converter or a voltage proportional thereto—is applied to one input 2a of the differential amplifier 2 and the output voltage of the reference voltage-source 3 is applied to another input 2b. The input signal 1a will therefore vary in accordance with variations in the output voltage of the converter.

The differential amplifier 2 is likewise obtainable in CMOS technology, for example, as a low-power CMOS operational amplifier 7611, so that the entire circuit according to FIG. 1—although the reference voltage source 3 cannot be manufactured in CMOS technology—has a power dissipation which is still below 10 mW. In addition, the circuit is integrable and even such that CMOS-building blocks and bipolar building blocks are accommodated on one chip.

To reduce the power dissipation still further the frequency of the square-wave generator can be lowered such that it is just above the threshold of hearing, for example at 18 kHz. This will reduce the switching operations per time unit for all relevant building blocks and hence also the dissipation linked with the switching operations. The internal losses of a direct voltage converter can be reduced to below 25 mW when using a control circuit in accordance with FIG. 1.

What is claimed is:

1. A pulse-width modulator for receiving from a square-wave generator (3) a periodic square-wave pulse signal (4a) having a fixed duty cycle and a fixed frequency, and for modulating such square-wave signal in accordance with an input signal (1a), said modulator comprising: a retriggerable monostable multivibrator (6); a timing circuit comprising a capacitor (7) and a current source (1) for charging said capacitor, said current source being controlled by the input signal; and an AND-gate (5); the square-wave pulse signal (4a) being applied to a trigger input (6a) of the multivibrator (6) and to an input (5a) of the AND-gate (5); said multivibrator (6) being triggered by falling edges of the square-wave signal, and producing an output signal which is applied to another input (5b) of said AND-gate (5).

2. A pulse-width modulator as claimed in claim 1, characterized in that said current source (1) comprises a transistor and a resistor connected to the emitter of said transistor, the collector of said transistor being connected to a terminal of the capacitor (7) and the base of the transistor being triggered by the input signal (1a).

3. A pulse-width modulator as claimed in claim 1, characterized in that the input signal (1a) is supplied by a differential amplifier (2) having an input for receiving a controlling variable voltage and another input for receiving a reference voltage produced by a reference voltage source (3).

4. A pulse-width modulator as claimed in claim 3, characterized in that the differential amplifier (2), the reference voltage source (3), the square-wave generator (4), the gate circuit (5), the monostable multivibrator (6) and the controllable current source (1) are comprised in a monolithically integrated circuit.

5. A pulse-width modulator as claimed in claim 3, characterized in that the monostable multivibrator (6), the square-wave generator (4), the gate circuit (5) and the differential amplifier (2) are implemented in CMOS-technology.

* * * * *